United States Patent
Yang

(10) Patent No.: US 8,845,835 B2
(45) Date of Patent: Sep. 30, 2014

(54) CARRIER STRUCTURE AND MANUFACTURING METHOD THEREOF

(75) Inventor: Chih-Hao Yang, Taipei (TW)

(73) Assignee: Lextar Electronics Corporation, Hsinchu (TW)

(*) Notice: Subject to any disclaimer, the term of this patent is extended or adjusted under 35 U.S.C. 154(b) by 276 days.

(21) Appl. No.: 13/415,447

(22) Filed: Mar. 8, 2012

(65) Prior Publication Data
US 2012/0228004 A1    Sep. 13, 2012

(30) Foreign Application Priority Data
Mar. 9, 2011  (TW) .............................. 100107987 A

(51) Int. Cl.
*H01L 25/00*    (2006.01)
*H01L 23/498*   (2006.01)

(52) U.S. Cl.
CPC . *H01L 23/49833* (2013.01); *H01L 2924/00013* (2013.01); *H01L 2924/09701* (2013.01)
USPC .............................. 156/83; 156/310; 156/314

(58) Field of Classification Search
USPC ............................................. 156/83, 310, 314
See application file for complete search history.

(56) References Cited

U.S. PATENT DOCUMENTS

| 4,937,133 | A | * | 6/1990 | Watanabe et al. ............. 428/209 |
| 5,166,292 | A | * | 11/1992 | Pottiger et al. .................. 526/59 |
| 7,717,587 | B2 | | 5/2010 | Lin et al. |

FOREIGN PATENT DOCUMENTS

| JP | 1-210430 A | * | 8/1989 |
| JP | 1-225540 A | * | 9/1989 |
| TW | 527857 B | | 4/2003 |

OTHER PUBLICATIONS

TW Office Action dated Apr. 30, 2013.
English Abstract translation of TWI527857 (Published Apr. 11, 2003).

* cited by examiner

*Primary Examiner* — Jeff Aftergut
(74) *Attorney, Agent, or Firm* — McClure, Qualey & Rodack, LLP

(57) ABSTRACT

A carrier structure and a manufacturing method thereof are provided. The carrier structure includes a substrate, an adhesive layer and a circuit board. The substrate has a plurality of adhesive regions. The adhesive layer is disposed on the adhesive regions. A thermal expansion coefficient of the adhesive layer corresponding one of the adhesive regions is greater than that of another adhesive region. The circuit board is disposed on the adhesive layer.

25 Claims, 7 Drawing Sheets

CARRIER STRUCTURE AND MANUFACTURING METHOD THEREOF

This application claims the benefit of Taiwan application Serial No. 100107987, filed Mar. 9, 2011, the subject matter of which is incorporated herein by reference.

BACKGROUND OF THE INVENTION

1. Field of the Invention

The invention relates in general to a carrier structure and a manufacturing method thereof, and more particularly to a carrier structure for carrying an electronic element and a manufacturing method thereof.

2. Description of the Related Art

Various innovated electronic products are constantly being introduced to the public as technologies persistently advance. For catching up with the innovated electronic products, novel electronic elements are continuously developed by manufacturers. Some of the electronic elements, e.g., diodes, optic sensors, fingerprint identification chips or micro lens sets, are carried on a carrier structure.

Carrier structures having different designs are needed for fulfilling requirements of different electronic elements. A procedure for carrying an electronic element onto a carrier structure involves several processes, e.g., a crystallization process, a die-attaching process, a wiring process, a solder-ball soldering process, an adhesive dripping process or a packaging process.

However, it is often found that carrier structures having special designs cause complications in the above manufacturing processes, and a yield rate is even thus significantly degraded. Therefore, there is a need for a solution for overcoming the current issues in the carrier structure techniques.

SUMMARY OF THE INVENTION

The invention is directed to a carrier structure and a manufacturing method thereof. With a design that utilizes an expansion coefficient of an adhesive layer of the carrier structure, the carrier structure appears as an inclined structure when complete. When implementing the carrier structure for carrying an electronic element such as a diode, an optic sensor, a fingerprint identification chip or a micro lens set, the inclined feature of the carrier structure is capable of adapting to requirements of various products. Further, the wiring, crystallization and die-attaching processes of the electronic element may be easily performed before the adhesive layer is expanded, thereby maintaining a good yield rate.

According to an aspect the present invention, a carrier structure is provided. The carrier structure includes a substrate, an adhesive layer and a circuit board. The substrate has a plurality of adhesive regions. The adhesive layer is disposed on the adhesive regions. A thermal expansion coefficient of the adhesive layer corresponding to one adhesive region is greater than that of another adhesive region. The circuit board is disposed on the adhesive layer.

According to another aspect of the present invention, a manufacturing method for a carrier structure is provided. The method includes steps of: providing a substrate having a plurality of adhesive regions; disposing an adhesive layer on the adhesive regions of the substrate, a thermal expansion coefficient of the adhesive layer corresponding to one of the adhesive regions being greater than that of another of the adhesive regions; heating the adhesive layer such that a thermal expansion size of the adhesive layer corresponding to one of the adhesive regions is greater than that corresponding to another of the adhesive regions.

The above and other aspects of the invention will become better understood with regard to the following detailed description of the preferred but non-limiting embodiments. The following description is made with reference to the accompanying drawings.

DETAILED DESCRIPTION OF THE INVENTION

In the embodiments below, with a design that utilizes an expansion coefficient of an adhesive layer of the carrier structure, the carrier structure appears as an inclined structure when complete. When implementing the carrier structure for carrying an electronic element such as a diode, an optic sensor, a fingerprint identification chip or a micro lens set, the inclined feature of the carrier structure is capable of adapting to requirements of various products. Further, the wiring, crystallization and die-attaching processes of the electronic element may be easily performed before the adhesive layer is expanded, thereby maintaining a good yield rate.

First Embodiment

Figure 1:
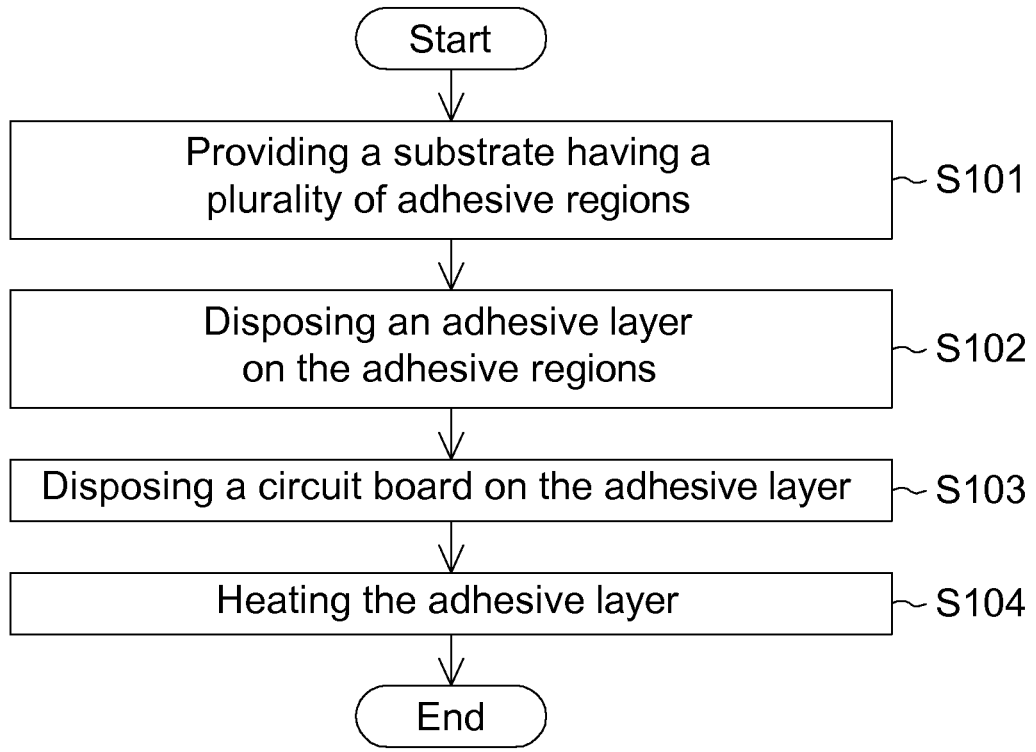
FIG. 1 is a flowchart of a manufacturing method for a carrier structure according to a first embodiment of the present invention.

FIG. 1 shows a flowchart of a manufacturing method for a carrier structure 100 according to a first embodiment of the present invention. FIGS. 2A to 2D show schematic diagrams of the steps in FIG. 1. In the description below, the manufacturing for the carrier structure 100 according to the embodiment shall be first given, followed by illustrating features of the completed carrier structure 100.

Figure 2A:
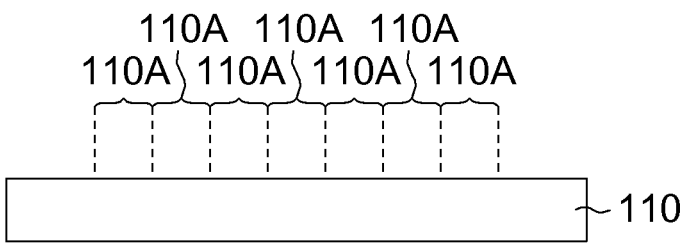
FIGS. 2A to 2D are schematic diagrams of steps in FIG. 1.

Referring to FIG. 2A, in step S101, a substrate 110 is provided. For example, the substrate 110 is a printed circuit board, an aluminum substrate, a copper substrate, a ceramic substrate or a glass substrate.

Figure 3:
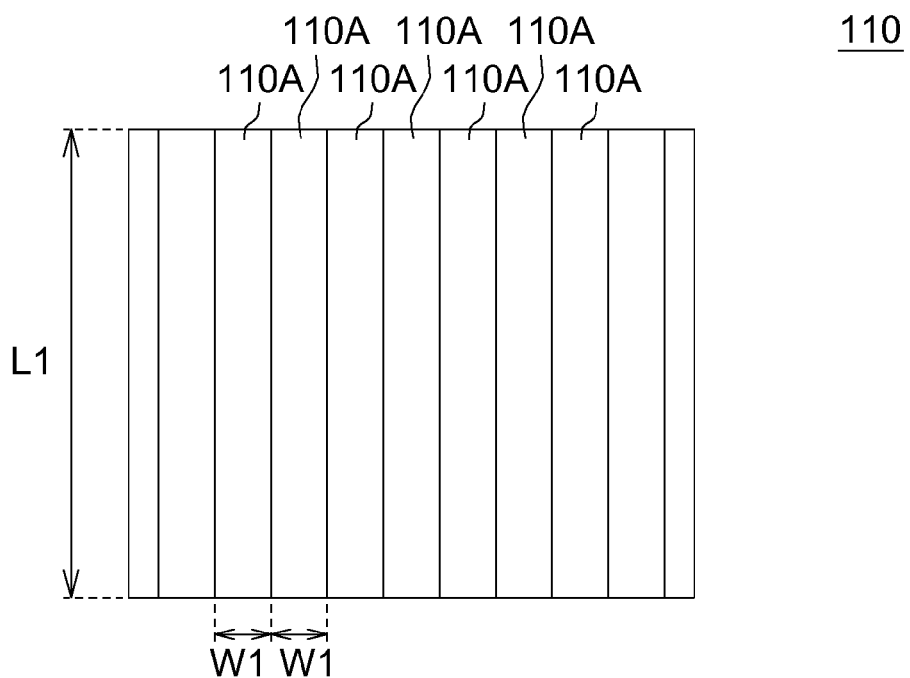
FIG. 3 is a top view of a substrate in FIG. 2A.

FIG. 3 shows a top view of the substrate 110 in FIG. 2A. In this embodiment, the substrate 110 includes seven adhesive regions 110A that are adjacently arranged in sequence. The number of the adhesive regions 110A is not to be construed as limiting the present invention. In another embodiment, the number of the adhesive regions 110 may be two, two to six, or above eight.

In this embodiment, the adhesive regions 110 are rectangles arranged in parallel to one another. Lengths L1 of the adhesive regions 110A are substantially equal, and widths W1 of the adhesive regions 110A are also substantially equal. That is to say, the adhesive regions 110A are substantially similar structures and areas thereof are substantially the same. However, the arrangement, shape and relationship of the adhesive regions 110A described above are for illustrative purposes rather than limiting the present invention thereto. In an embodiment, the adhesive regions 110A may be circles, triangles, polygons, or irregularly-shaped regions.

Figure 4A:
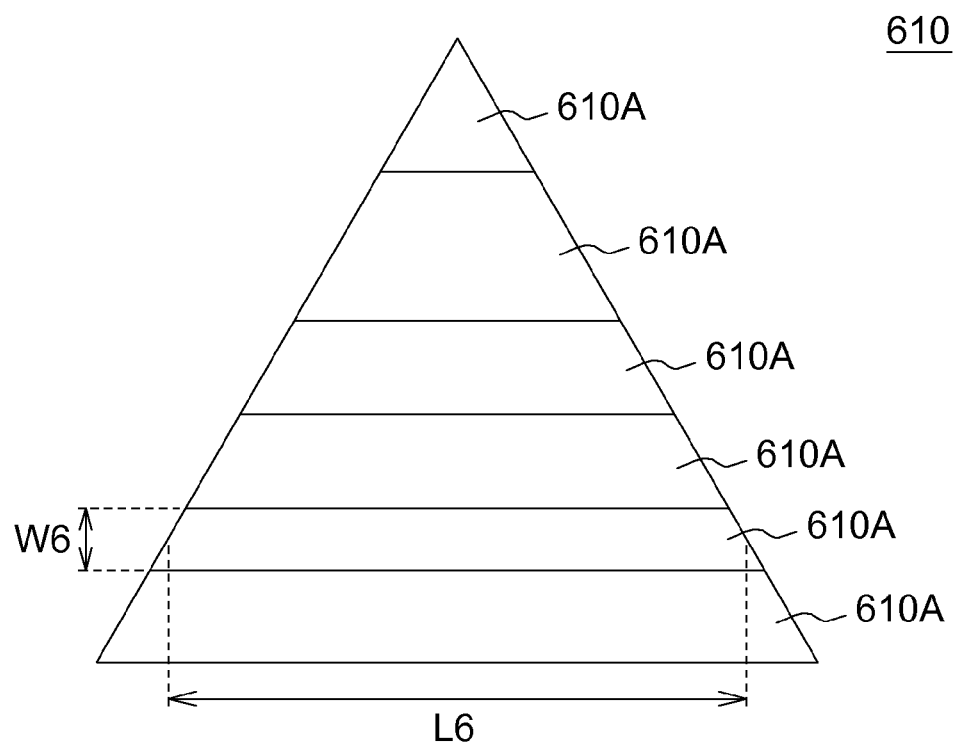
FIGS. 4A and 4B are top views of substrates according to other embodiments.
Figure 4B:
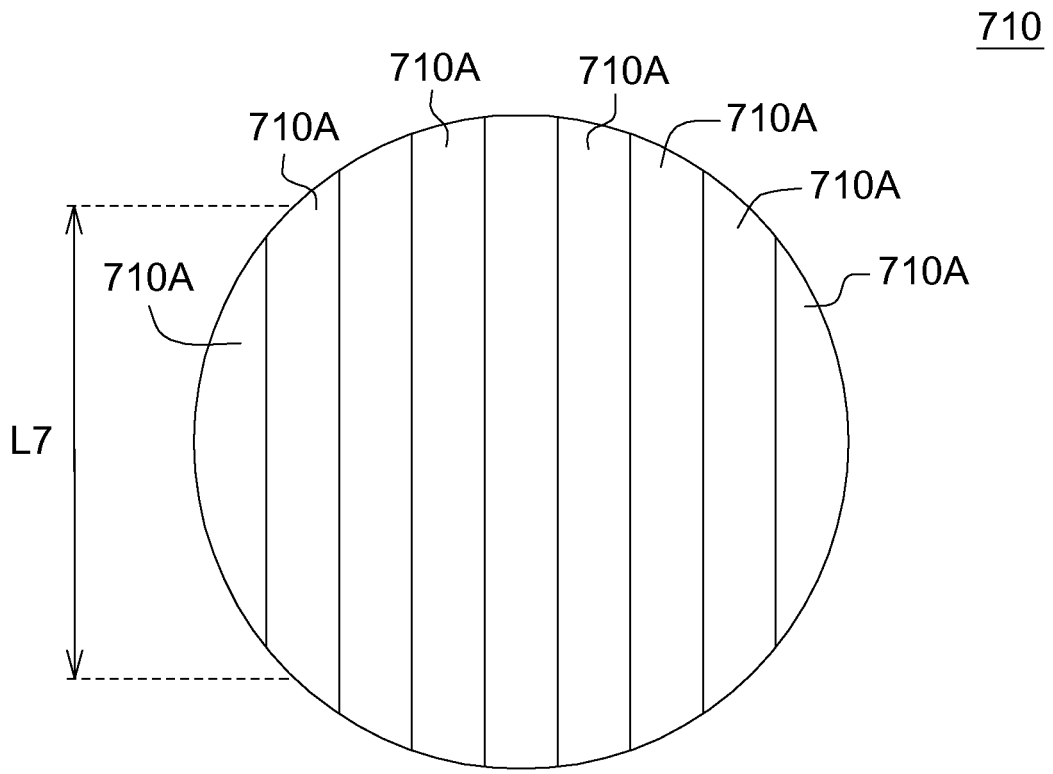

The adhesive regions 110A may also be different structures having different lengths L1 and different width W1. For example, FIGS. 4A to 4B show top views of substrates 610 and 710 according to other embodiments. As shown in FIG. 4A, lengths L6 of six adhesive regions 610A of the substrate 610 may be gradually decreased to altogether form a triangular substrate. The widths L6 of the six adhesive regions 610A may be different. Alternatively, as shown in FIG. 4B, lengths L7 of the adhesive regions 710A of the substrate 710 may be gradually increased and then decreased to altogether form a circular substrate.

Figure 2B:
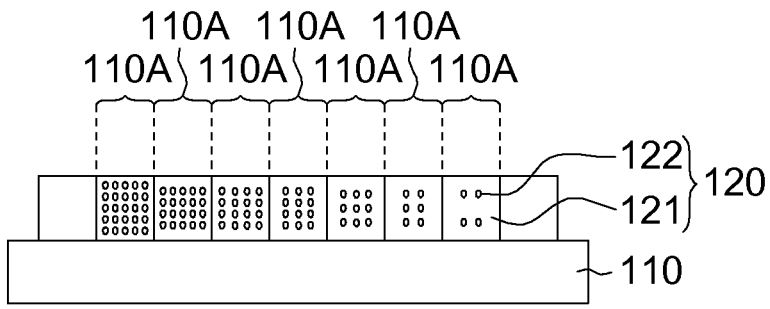

Referring to FIG. 2B, in step S102, the adhesive layer 102 is disposed on the adhesive regions 110A of the substrate 110. In this embodiment, the adhesive layer 120 includes a thermosetting adhesive material 121 and a thermosetting expansion material 122. For example, the thermosetting adhesive material 121 is a thermosetting adhesive, and the thermosetting expansion material 122 is a thermosetting foaming material.

The thermosetting expansion material 122 is doped in the thermosetting adhesive material 121. The thermosetting expansion material 122 is distributed at all of the adhesive regions 110A. Materials of the thermosetting expansion material 122 at all of the adhesive regions 110A are the same. A doping concentration of the thermosetting expansion material 122 at the adhesive regions 110A may not be the same. That is to say, at two adhesive regions 110A, the doping concentration of the thermosetting expansion material 122 at one adhesive region 110A is greater than that at the other adhesive region 110A.

As a result, expansion coefficients of the adhesive layer 120 corresponding to the adhesive regions 110A are not the same. That is to say, at two adhesive regions 110A, the thermal expansion coefficient of the thermosetting expansion material 122 corresponding to one adhesive region 110A is greater than that corresponding to the other adhesive region 110A.

The thermal expansion coefficients of the adhesive layer 120 corresponding to the adhesive regions 110A may be increased at a constant value or a ratio, depending on the selected material of the adhesive layer 120 and requirements of a designer.

Figure 2C:
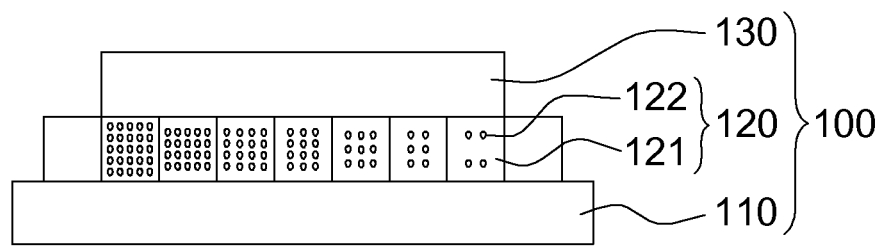

In step S103, as shown in FIG. 2C, the circuit board 130 is disposed on the adhesive layer 120. The circuit board 130 is for carrying an electronic element such as a light-emitting diode, an optic sensor, a fingerprint identification chip or a lens set. It should be noted that the type of electronic element carried by the circuit board 130 is not to be construed as a limitation to the present invention.

Figure 2D:
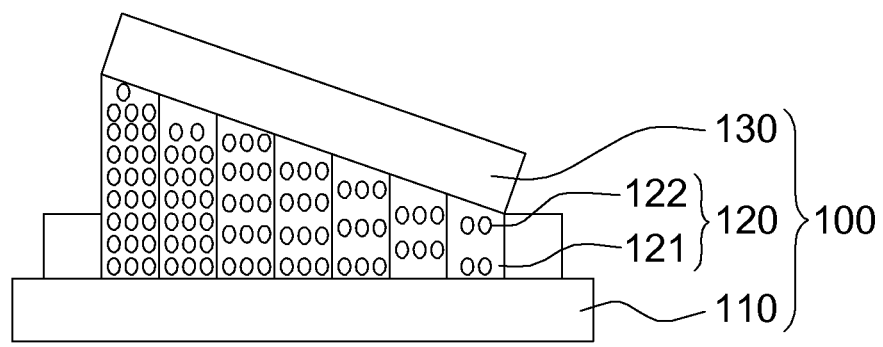

Referring to FIG. 2D, in step S104, the adhesive layer 120 is heated to be expanded, and then sets in a predetermined shape. In this embodiment, the thermal expansion coefficient of the thermosetting expansion material 122 is greater than that of the adhesive material 121. If the doping concentration of the thermosetting expansion material 122 is high, then the expansion size of the adhesive layer 120 gets large, and so a volume of the adhesive layer 120 is correspondingly large when the adhesive layer 120 is set and shaped after heating.

As shown in FIG. 2D, if the thermal expansion coefficients of the adhesive layer 120 corresponding to the adhesive regions 110A are sequentially increased, then the expansion sizes of the adhesive layer 120 corresponding to the adhesive regions 110A after heating and thermosetting are also sequentially increased. More particularly, when thermal expansion directions of the adhesive layer 120 corresponding to the adhesive regions 110A are substantially the same (e.g., towards above the substrate 110), a relationship between the expansion sizes and the expansion coefficients of the adhesive layer 120 becomes more distinct.

Accordingly, an inclined circuit board 130 is formed after the step S104 of heating and thermosetting is performed. When implementing the carrier structure 100 for carrying an electronic element such as a diode, an optic sensor, a fingerprint identification chip or a micro lens set, the inclined feature of the carrier structure 100 is capable of adapting to requirements of various products.

Further, the step S103 of disposing the circuit board 130 is performed before the step S104 of heating and thermosetting. More specifically, at the time of disposing the circuit board 130, the adhesive layer 120 is not yet expanded. Thus, after the step S103, a wiring, crystallization and/or die-attaching process of the electronic element may be performed with ease to maintain a good yield rate. After the wiring, crystallization and/or die-attaching process, the inclined carrier structure 100 may still be completed via the step S104.

Second Embodiment

Figure 5A:
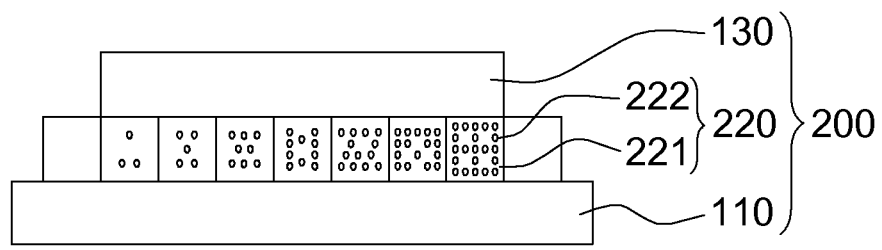
FIGS. 5A and 5B are schematic diagrams of a carrier structure before and after heating and thermosetting according to a second embodiment.
Figure 5B:
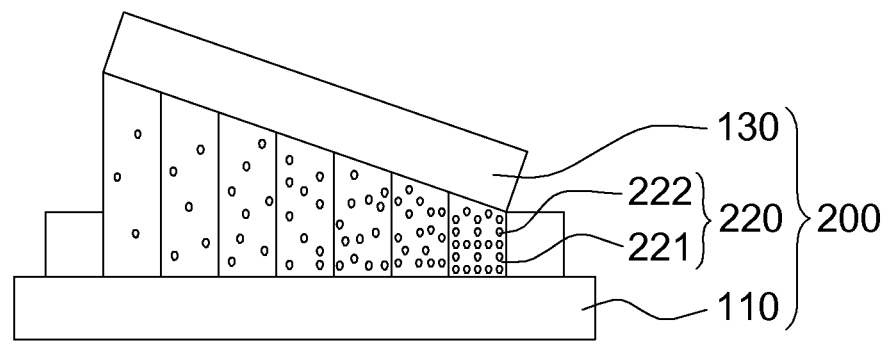

FIGS. 5A and 5B show schematic diagrams of a carrier structure 200 before and after heating and thermosetting according to a second embodiment of the present invention. A main difference between the carrier structure 200 and a manufacturing method thereof according to the second embodiment and the carrier structure 100 and the manufacturing method thereof according to the first embodiment is that, a different material is adopted for an adhesive layer 220. Other details of the second embodiment are similar those of the first embodiment.

Referring to FIGS. 5A and 5B, in this embodiment, the thermal expansion coefficient of a thermosetting expansion material 222 is smaller than that of a thermosetting adhesive material 221. Thus, in Step S102, if the doping concentration of the thermosetting expansion material 222 is small, then the expansion size of the adhesive layer 220 becomes large, and so a volume of the adhesive layer 120 is correspondingly large after the step S104 of heating and thermosetting.

Accordingly, the inclined circuit board 130 is formed after the step S104 of heating and thermosetting in the second embodiment. When implementing the carrier structure 200 for carrying an electronic element such as a diode, an optic sensor, a fingerprint identification chip or a micro lens set, the inclined feature of the carrier structure is capable of adapting to requirements of various products. Further, after the step S103, a wiring, crystallization and/or die-attaching process of the electronic element may be performed with ease to maintain a good yield rate a good yield rate. After the wiring, crystallization and/or die-attaching process, the inclined carrier structure 200 may still be completed via the step S104.

Third Embodiment

Figure 6A:
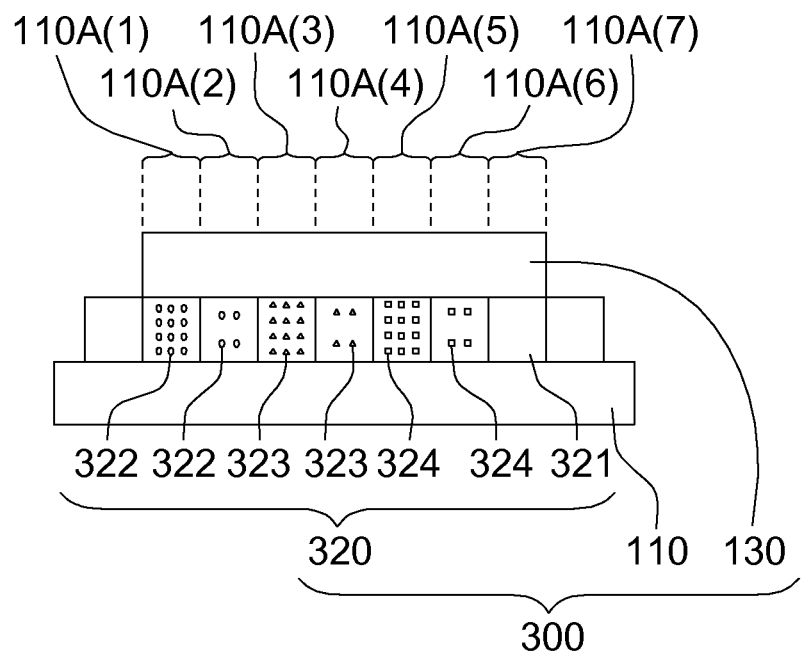
FIGS. 6A and 6B are schematic diagrams of a carrier structure before and after heating and thermosetting according to a third embodiment.
Figure 6B:
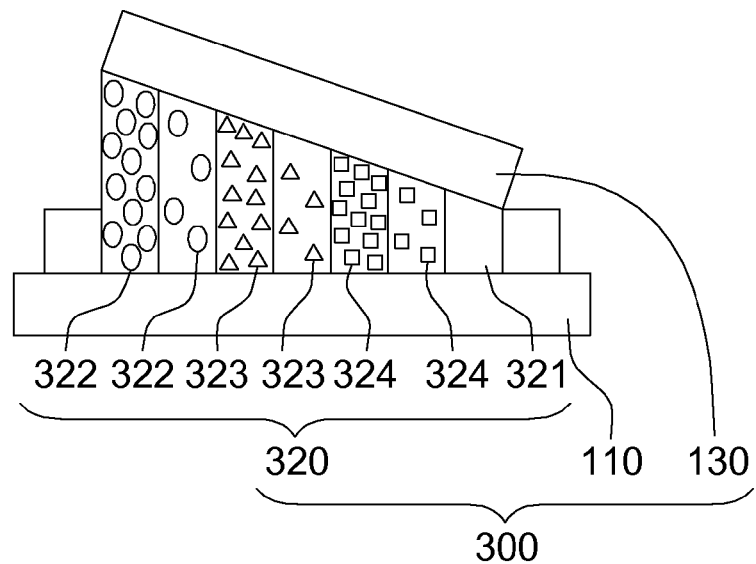

FIGS. 6A and 6B show schematic diagrams of a carrier structure 300 before and after heating and thermosetting according to a third embodiment. A main difference between the carrier structure 300 and a manufacturing method thereof according to the third embodiment and the carrier structure 100 and the manufacturing method thereof according to the first embodiment is that, a different material is adopted for an adhesive layer 320. Other details of the third embodiment are similar those of the first embodiment.

Referring to FIGS. 6A and 6B, in this embodiment, the adhesive layer 320 includes a thermosetting adhesive material 321 and at least two kinds of thermosetting expansion materials. In this embodiment, three kinds of thermosetting expansion materials 322, 323 and 324 are implemented. The thermosetting expansion materials 322, 323 and 324 are doped to the thermosetting adhesive layer 321. In this embodiment, the thermosetting expansion material 322 is doped at adhesive regions 110A(1) and 110A(2); the doping concentration of the thermosetting expansion material 322 at the adhesive regions 110A(1) is greater than that of the thermosetting expansion material 322 at the adhesive regions 110A(2). The thermosetting expansion material 323 is doped at adhesive regions 110A(3) and 110A(4); the doping concentration of the thermosetting expansion material 323 at the adhesive regions 110A(3) is greater than that of the thermosetting expansion material 323 at the adhesive regions 110A (4). The thermosetting expansion material 324 is doped at adhesive regions 110A(5) and 110A(6); the doping concentration of the thermosetting expansion material 324 at the adhesive regions 110A(5) is greater than that of the thermosetting expansion material 324 at the adhesive regions 110A (6). An adhesive region 110A(7) is not doped with any of the thermosetting expansion materials 322, 323 and 324.

Thus, in the step S102, because the different thermosetting expansion materials 322, 323 and 324 are implemented, the expansion sizes at different parts of the adhesive layer 320 will be varied, so that the volumes at different parts of the adhesive layer 320 will be also varied after the step S104 of heating and thermosetting. In this embodiment, the thermal expansion coefficient of the thermosetting expansion material 322 is greater than that of the thermosetting expansion material 323; the thermal expansion coefficient of the thermosetting expansion material 323 is greater than that of the thermosetting expansion material 324; the thermal expansion coefficient of the thermosetting expansion material 324 is greater than that of the thermosetting adhesive material 321. Therefore, the expansion sizes of the adhesive layer 320 corresponding to the adhesive regions 110A(1) to 110A(7) will be sequentially increased from the adhesive region 110A (1) towards the adhesive region 110A(7). However, it should be noted that relationships between the thermal expansion coefficients of the thermosetting expansion materials 322, 323 and 324 and the thermosetting adhesive material 321, as well as the arrangement and relationship of the doping concentration of thermosetting expansion materials 322, 323 and 324, are taken as examples for illustrations in this embodiment, and are not to be construed as limitations to the present invention. Therefore, related details of the thermosetting expansion materials 322, 323 and 324 and the thermosetting adhesive material 321 may be designed based on actual requirements.

Accordingly, an inclined circuit board 130 is formed after the step S104 of heating and thermosetting in the third embodiment. When implementing the carrier structure 300 for carrying an electronic element such as a diode, an optic sensor, a fingerprint identification chip or a micro lens set, the inclined feature of the carrier structure is capable of adapting to requirements of various products. Further, after the step S103 is performed, a wiring, crystallization and/or die-attaching process of the electronic element may be performed with ease to maintain a good yield rate. After the wiring, crystallization and/or die-attaching process, the inclined carrier structure 300 may still be completed via the step S104.

Fourth Embodiment

Figure 7A:
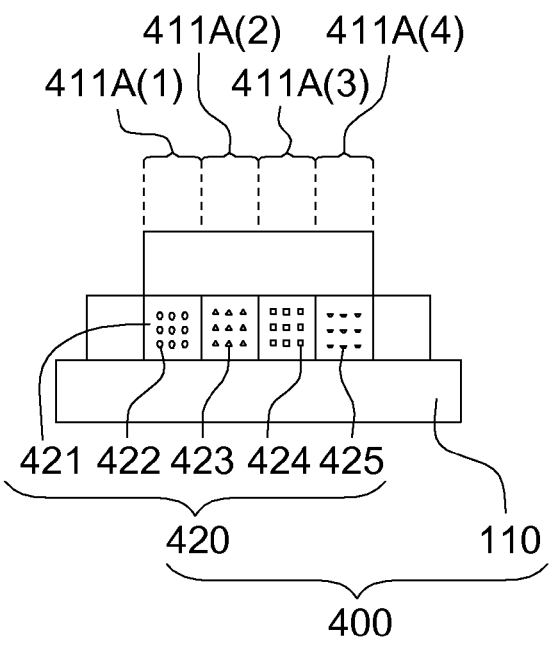
FIGS. 7A and 7B are schematic diagrams of a carrier structure before and after heating and thermosetting according to a fourth embodiment.
Figure 7B:
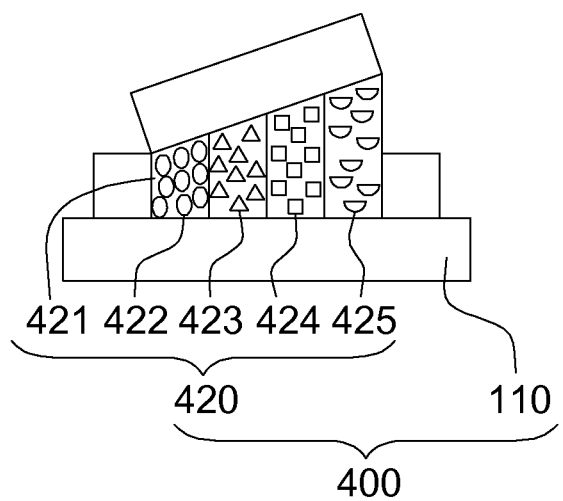

FIGS. 7A and 7B show schematic diagrams of a carrier structure 400 before and after heating and thermosetting according to a fourth embodiment. A main difference between the carrier structure 400 and a manufacturing method thereof according to the fourth embodiment and the carrier structure 100 and the manufacturing method thereof according to the first embodiment is that, a different material is adopted for an adhesive layer 420. Other details of the third embodiment are similar those of the first embodiment.

Referring to FIGS. 7A and 7B, in this embodiment, the adhesive layer 420 includes a thermosetting material 421 and at least two kinds of thermosetting expansion materials. In this embodiment, four thermosetting expansion materials 422, 423, 424 and 425 are implemented and doped in the thermosetting adhesive material 421. The thermosetting expansion material 422 is doped at an adhesive region 410A (1). The thermosetting expansion material 423 is doped at an adhesive region 410A(2). The thermosetting expansion material 424 is doped at an adhesive region 410A(3). The thermosetting expansion material 425 is doped at an adhesive region 410A(4).

Thus, in step S102, because the different thermosetting expansion materials 422, 423, 424 and 425 are implemented, the expansion sizes at different parts of the adhesive layer 420 are varied, so that the volumes at different parts of the adhesive layer 420 are also varied after the step S104 of heating and thermosetting. In this embodiment, the thermal expansion coefficients of thermosetting expansion materials 422 to 425 are sequentially increased, and the thermal expansion coefficient of the thermosetting expansion material 422 is greater than that of the thermosetting adhesive material 421. As a result, the expansion sizes of the adhesive layer 420 corresponding to the adhesive regions 410A(1) to 410A(4) are sequentially increased from the adhesive region 410A(1) towards the adhesive region 410A(4).

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A carrier structure, comprising:
   a substrate, having a plurality of adhesive regions;
   an adhesive layer, disposed on the adhesive regions, wherein a thermal expansion coefficient of one of the adhesive regions corresponding to the adhesive layer is greater than that of another of the adhesive regions, and the adhesive layer comprises:
   a thermosetting adhesive material; and
   a thermal expansion material, doped in the thermosetting adhesive material, and distributed to all of the adhesive regions, wherein a doping concentration of the thermal expansion material at one of the adhesive regions is greater than that of the thermal expansion material at another of the adhesive regions, and a thermal expansion coefficient of the thermal expansion material is greater than that of the thermosetting adhesive material; and
   a circuit board, disposed on the adhesive layer.

2. The carrier structure according to claim 1, wherein the adhesive layer comprises:
   a thermosetting adhesive material; and
   two thermal expansion materials, doped in the thermosetting adhesive material, and respectively being located in two of the adhesive regions.

3. The carrier structure according to claim 1, wherein the adhesive regions are rectangles arranged in parallel.

4. The carrier structure according to claim 3, wherein lengths of the adhesive regions are substantially the same and widths of the adhesive regions are substantially the same.

5. The carrier structure according to claim 1, wherein the adhesive regions are adjacently arranged in sequence.

6. The carrier structure according to claim 1, wherein areas of the adhesive regions are substantially the same.

7. The carrier structure according to claim 1, wherein thermal expansion directions of the adhesive layer corresponding to the adhesive regions are substantially the same.

8. The carrier structure according to claim 1, wherein thermal expansion coefficients of the adhesive layer corresponding to the adhesive regions are sequentially increased.

9. A manufacturing method for a carrier structure, comprising:
   providing a substrate having a plurality of adhesive regions;
   disposing an adhesive layer on the adhesive regions of the substrate, a thermal expansion coefficient of one of the adhesive regions corresponding to the adhesive layer being greater than that of another of the adhesive regions;
   disposing a circuit board on the adhesive layer; and
   heating the adhesive layer, so that a thermal expansion size of the adhesive layer corresponding to one of the adhesive regions is greater than that of the adhesive layer corresponding to another of the adhesive regions;
   wherein the adhesive layer comprises a thermosetting adhesive material and two thermal expansion materials, and the two thermal expansion materials are doped in the thermosetting adhesive material and are respectively located in two of the adhesive regions.

10. The manufacturing method according to claim 9, wherein the adhesive layer comprises a thermosetting adhesive material and a thermal expansion material, the thermal expansion material is doped in the thermosetting adhesive material and is distributed to all of the adhesive regions, and a doping concentration of the thermal expansion material at one of the adhesive regions is greater than that of the thermal expansion material at another of the adhesive regions.

11. The manufacturing method according to claim 10, wherein a thermal expansion coefficient of the thermal expansion material is greater than that of the thermosetting adhesive material.

12. The manufacturing method according to claim 10, wherein a thermal expansion coefficient of the thermal expansion material is smaller than that of the thermosetting adhesive material.

13. The manufacturing method according to claim 9, wherein the adhesive regions are rectangles arranged in parallel.

14. The manufacturing method according to claim 13, wherein lengths of the adhesive regions are substantially the same and widths of the adhesive regions are substantially the same.

15. The manufacturing method according to claim 9, wherein the adhesive regions are adjacently arranged in sequence.

16. The manufacturing method according to claim 9, wherein areas of the adhesive regions are substantially the same.

17. The manufacturing method according to claim 9, wherein thermal expansion directions of the adhesive layer corresponding to the adhesive regions are substantially the same.

18. The manufacturing method according to claim 9, wherein thermal expansion coefficients of the adhesive layer corresponding to the adhesive regions are sequentially increased.

19. A carrier structure, comprising:
   a substrate, having a plurality of adhesive regions;
   an adhesive layer, disposed on the adhesive regions, wherein a thermal expansion coefficient of one of the adhesive regions corresponding to the adhesive layer is greater than that of another of the adhesive regions, and the adhesive layer comprises:
   a thermosetting adhesive material; and
   a thermal expansion material, doped in the thermosetting adhesive material, and distributed to all of the adhesive regions, wherein a doping concentration of the thermal expansion material at one of the adhesive regions is greater than that of the thermal expansion material at another of the adhesive regions, and a thermal expansion coefficient of the thermal expansion material is smaller than that of the thermosetting adhesive material; and
   a circuit board, disposed on the adhesive layer.

20. The carrier structure according to claim 19, wherein the adhesive regions are rectangles arranged in parallel.

21. The carrier structure according to claim 20, wherein lengths of the adhesive regions are substantially the same and widths of the adhesive regions are substantially the same.

22. The carrier structure according to claim 19, wherein the adhesive regions are adjacently arranged in sequence.

23. The carrier structure according to claim 19, wherein areas of the adhesive regions are substantially the same.

24. The carrier structure according to claim 19, wherein thermal expansion directions of the adhesive layer corresponding to the adhesive regions are substantially the same.

25. The carrier structure according to claim 19, wherein thermal expansion coefficients of the adhesive layer corresponding to the adhesive regions are sequentially increased.

* * * * *